US011042150B2

(12) United States Patent
Hansman et al.

(10) Patent No.: US 11,042,150 B2
(45) Date of Patent: Jun. 22, 2021

(54) AIRCRAFT FUEL EFFICIENCY TUNNEL DISPLAY FOR PILOTS AND DISPATCHERS

(71) Applicant: Massachusetts Institute of Technology, Cambridge, MA (US)

(72) Inventors: Robert John Hansman, Cambridge, MA (US); Luke Loftis Jensen, Cambridge, MA (US); Clement Li, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 433 days.

(21) Appl. No.: 15/955,127

(22) Filed: Apr. 17, 2018

(65) Prior Publication Data

US 2019/0317489 A1 Oct. 17, 2019

(51) Int. Cl.
*G05D 1/00* (2006.01)
*G08G 5/00* (2006.01)
*B64D 37/00* (2006.01)
*G06F 30/20* (2020.01)

(52) U.S. Cl.
CPC ......... *G05D 1/0005* (2013.01); *B64D 37/005* (2013.01); *G06F 30/20* (2020.01); *G08G 5/0021* (2013.01); *G08G 5/0034* (2013.01); *G08G 5/0039* (2013.01); *G08G 5/0052* (2013.01)

(58) Field of Classification Search
CPC .. G08G 5/0052; G08G 5/0021; G08G 5/0039; G06F 30/20; G05D 1/0005
See application file for complete search history.

(56) References Cited

U.S. PATENT DOCUMENTS

| 4,021,009 A * | 5/1977 | Baker ................. G05D 1/0607 244/180 |
| 7,110,866 B1 * | 9/2006 | Dutu .................. B64D 45/0031 701/11 |
| 8,793,039 B1 * | 7/2014 | Hammack ............. G01C 23/00 340/971 |
| 8,965,673 B2 * | 2/2015 | del Pozo de Poza ....................... G06Q 10/047 701/123 |

(Continued)

OTHER PUBLICATIONS

Bailin et al., "Traffic Aware Strategic Aircrew Requests (TASAR)", 12th AIAA Aviation Technology, Integration, and Operations (ATIO) Conference and 14th AIAA/ISSM Sep. 17-19, 2012, Indianapolis, Indiana, 9 pages.

(Continued)

*Primary Examiner* — Ramsey Refai
(74) *Attorney, Agent, or Firm* — Hamilton, Brook, Smith & Reynolds, P.C.

(57) ABSTRACT

An embodiment includes an apparatus that supports a user to make planning decisions of fuel efficiency of an aircraft versus time of arrival of the aircraft along a flight path. An embodiment of the apparatus accepts input data related to the aircraft. The input data may include (i) flight plan data that includes a flight path of the aircraft, (ii) state of the aircraft along the flight path, (iii) environmental data, and (iv) an aircraft performance model of the aircraft. The apparatus calculates aircraft performance and an objective function for a range of altitudes and speeds as a function of the input data. The apparatus causes a user interface to display aircraft performance contour boundaries and a vertical routing path that meets the objective function to provide graphical representations to support a user's planning decisions.

25 Claims, 12 Drawing Sheets

(56) References Cited

U.S. PATENT DOCUMENTS

| | | | | |
|---|---|---|---|---|
| 9,443,434 | B2* | 9/2016 | Hale | G08G 5/003 |
| 9,815,569 | B2* | 11/2017 | Horsager | B64D 45/00 |
| 10,121,384 | B2* | 11/2018 | Hale | G08G 5/0039 |
| 2005/0192717 | A1* | 9/2005 | Tafs | G07C 5/085 |
| | | | | 701/3 |
| 2015/0348423 | A1* | 12/2015 | Chaubey | G05D 1/0005 |
| | | | | 701/18 |
| 2016/0093217 | A1* | 3/2016 | Hale | G08G 5/0021 |
| | | | | 701/120 |
| 2017/0076614 | A1* | 3/2017 | Shay | G05D 1/0676 |
| 2017/0249849 | A1* | 8/2017 | De Prins | G01C 23/005 |
| 2018/0082595 | A1* | 3/2018 | Hamilton | G06Q 10/06375 |
| 2019/0033853 | A1* | 1/2019 | O'Laughlin | G08G 5/0039 |

OTHER PUBLICATIONS

Folse et al., "Cruise Altitude and Speed Optimization Implemented in a Pilot Decision Support Tool", 16th AIAA Aviation Technology, Integration, and Operations Conference, American Institute of Aeronautics and Astronautics, 10 pages, Jun. 2016.

Jensen et al., "Commercial Airline Altitude Optimization Strategies for Reduced Cruise Fuel Consumption*", AIAA Aviation, Jun. 16-20, 2014, Atlanta, GA, 14th AIAA Aviation Technology, Integration, and Operations Conference, 13 pages.

Jensen et al., "Cruise Fuel Reduction Potential from Altitude and Speed Optimization in Global Airline Operations*", Eleventh USA/Europe Air Traffic Management Research and Development Seminar (ATM Jun. 2015), 10 pages.

Jensen et al., "Fuel Efficiency Benefits and Implementation Considerations for Cruise Altitude and Speed Optimization in the National Airspace System", May 2014, 86 pages.

Maris et al., "Traffic Aware Planner (TAP) Flight Evaluation", AIAA Aviation Forum, Jun. 16-20, 2014, Atlanta, GA, 14th AIAA Aviation Technology, Integration, and Operations Conference, 23 pages.

Tran et al., "Fuel Benefit from Optimal Trajectory Assignment on the North Atlantic Tracks", May 2016, 63 pages.

* cited by examiner

500

| | | | Planned Altitude (Feet, Thousands) | | | |
|---|---|---|---|---|---|---|
| VERT1 | N45.25 | W074.84 | | 880 | 086° | 551 | -02 |
| VERT1 | 3161 | 0:06 | 35 | 1013 | 055° | 460 | 000/132 |
| AGLUX | N46.21 | W073.37 | | 800 | 094° | 551 | +00 |
| AGLUX | 3580 | 0:15 | 35 | 2231 | 051° | 461 | 002/121 |
| BAREE | N48.15 | W069.30 | | 800 | 068° | 562 | +07 |
| BAREE | 2879 | 0:37 | 35 | 5202 | 071° | 465 | 007/107 |
| TUDEP | N51.17 | W053.23 | | 800 | 086° | 551 | -09 |
| TUDEP | 2229 | 1:47 | 35 | 14552 | 065° | 461 | 029/093 |
| N52W050 | N52.00 | W050.00 | | 800 | 086° | 552 | -01 |
| 5250N | 2098 | 2:01 | 35 | 16363 | 082° | 460 | 031/095 |
| N52W040 | N52.00 | W040.00 | | 800 | 077° | 579 | -03 |
| 5240N | 1777 | 2:41 | 35 | 21392 | 076° | 459 | 019/126 |
| N53W030 | N53.00 | W030.00 | | 800 | 076° | 565 | -08 |
| 5330N | 1355 | 3:19 | 35 | 26004 | 083° | 456 | 107/124 |
| N54W020 | N54.00 | W020.00 | | 800 | 088° | 534 | +13 |
| 5420N | 994 | 3:59 | 35 | 30912 | 093° | 469 | 170/084 |

| CHART WX | FL280 | | FL280 | | FL300 | | FL310 | | FL320 | |
|---|---|---|---|---|---|---|---|---|---|---|
| | TD | WIND | TD | WIND | TD | WIND | TD | WIND | TD | WIND |
| VG011 | P09 | 091/133 | P08 | 091/137 | P08 | 092/140 | P07 | 092/142 | P07 | 091/143 |
| AGLUK | P09 | 091/132 | P08 | 091/132 | P08 | 091/132 | P08 | 091/132 | P07 | 090/131 |
| BAKEE | P12 | 085/113 | P11 | 085/117 | P09 | 085/121 | P08 | 085/119 | P08 | 085/117 |
| TUDEP | P11 | 055/104 | P11 | 054/105 | P10 | 054/105 | P12 | 056/104 | P08 | 057/102 |
| TUDEP | P11 | 055/104 | P11 | 054/105 | P10 | 054/105 | P12 | 056/104 | P08 | 057/102 |
| 5250N | P12 | 056/104 | P12 | 056/105 | P13 | 056/105 | P13 | 057/103 | P11 | 057/102 |

FIG. 6

AIRCRAFT FUEL EFFICIENCY TUNNEL DISPLAY FOR PILOTS AND DISPATCHERS

GOVERNMENT SUPPORT

This invention was made with Government support under Contract No. FA8702-15-D-0001 awarded by the U.S. Air Force. The Government has certain rights in the invention.

BACKGROUND

Aircraft displays provide a variety of flight information to pilots. Such information aids pilots in making decisions regarding flight of the aircraft.

SUMMARY

Embodiments of the present disclosure are directed to apparatuses, computer methods, systems, and computer program products for supporting flight planning decisions.

In some embodiments, an apparatus includes an input module configured to accept input data related to an aircraft. The input data includes (i) flight plan data that includes a flight path of the aircraft, (ii) state of the aircraft along the flight path, (iii) environmental data, and (iv) an aircraft performance model of the aircraft. The apparatus includes a calculation module configured to calculate aircraft performance and an objective function for a range of altitudes and speeds as a function of the input data. The apparatus includes a display module configured to cause a user interface to display aircraft performance contour boundaries and a vertical routing path that meets the objective function to provide graphical representations to support a user's planning decisions of fuel efficiency of the aircraft versus time of arrival of the aircraft along the flight path.

It should be understood that embodiments in the form of computer methods, systems, and computer program products may include element corresponding to the apparatus elements. Similarly, the following example embodiments are directed to an apparatus, but pertain similarly to the computer methods, systems, and computer program products.

In some embodiments, the apparatus accepts an input from the user along the flight path and updates the aircraft performance model based on the input data associated with the user input.

In some embodiments, the apparatus enables the user to specify, as the user input, one or more altitudes within the range of altitudes for one or more segments of the flight path.

In some embodiments, the apparatus includes at least one of the following: the state of the aircraft along the flight path, including at least one of a position, altitude, and speed of the aircraft; environmental data including at least one of a wind, temperature, and weather condition; and aircraft performance model including at least one of: aircraft performance model includes at least one of: type of the aircraft, planned flight path, aircraft altitude, speed of the aircraft, weight of the aircraft that dynamically changes along the flight path, aircraft weight center of gravity, wind and temperature data that dynamically changes along the planned flight path, fuel burn versus altitude, fuel burn versus Mach number, fuel burn versus cost index, cost index, current recommended trajectory step constraint, and step climb constraints considering the airspace to be traversed along the planned flight path.

In some embodiments, the apparatus causes the user interface to display additional information, including at least one of weather, atmospheric turbulence, aircraft traffic, terrain information, and maximum altitude of the aircraft based on aircraft weight and atmospheric conditions.

In some embodiments, the apparatus calculates projections of the aircraft performance along the flight path, during which at least a portion of the flight path is between the aircraft performance contour boundaries, and wherein the display module is further configured to display the projections of the aircraft performance along the flight path.

In some embodiments, the apparatus performs the functions of accepting, calculating, and causing in advance of the aircraft's commencing the flight along the flight path.

In some embodiments, the apparatus applies a constant flight path state for a given time or distance following a change of altitude or speed by the aircraft.

In some embodiments, the apparatus calculates the aircraft performance using a dynamically changing aircraft performance model.

In some embodiments, the apparatus changes the aircraft performance model dynamically based on a change of the input data.

In some embodiments, the apparatus accepts an input of the user along the flight path and updates the aircraft performance model based on the input data associated with the user input.

In some embodiments, the apparatus enables the user to specify, as the user input, one or more altitudes within the range of altitudes for one or more segments of the flight path.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 5 illustrates an existing baseline textual flight plan format.

FIG. 6 illustrates an existing baseline textual wind and temperature aloft report.

DETAILED DESCRIPTION

Figure 1A:
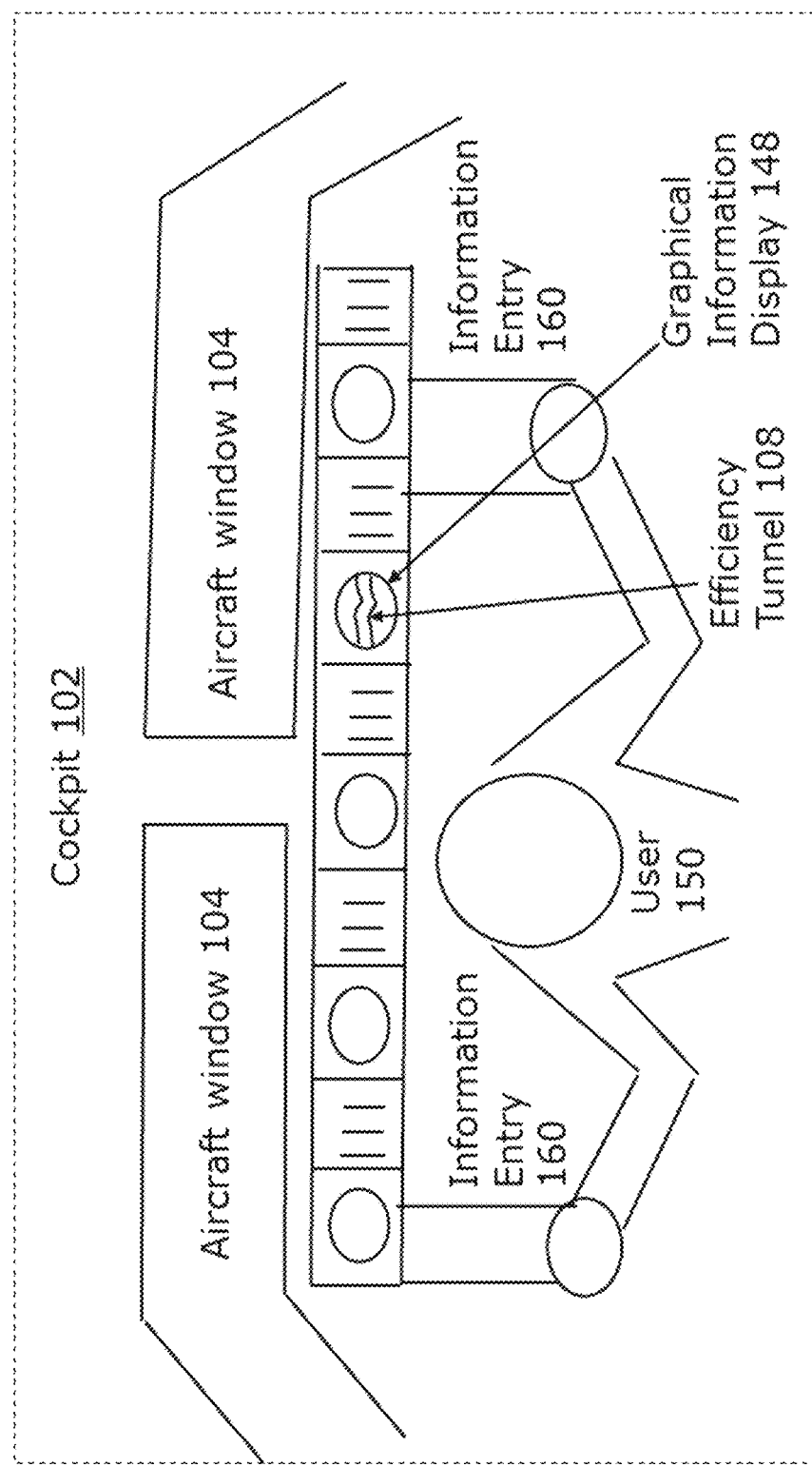
FIG. 1A is an aircraft cockpit view that features a graphical information display, according to embodiments of an apparatus employed by the present disclosure.

A description of example embodiments follows.

Existing approaches to providing aircraft (e.g., airplane) graphical user interfaces have multiple problems. In current operations, aircraft pilots have limited ability to assess fuel efficiency implications from altitude changes or changing wind conditions. Pilots are normally provided with target altitudes at each waypoint in a flight plan based on pre-flight optimization performed by a flight dispatcher. An example of this format is shown in FIG. 5 to follow. FIG. 5 illustrates an existing baseline textual flight plan format 500. While the planned altitude column 502 highlighted in FIG. 5 is derived using best-available weather forecasts and airspace information, no contextual data is provided in terms of sensitivity or alternatives in the event of changes.

Existing approaches are problematic in that a change in altitude may be required due to turbulence at a given altitude, a change in routing, or other factors, the pilot must select a new cruise altitude based on the information available in the cockpit. This includes aircraft performance tables, limited wind information loaded in the flight management computer, and textual weather forecasts 600, such as the example shown in FIG. 6. As illustrated in FIG. 6, these existing information sources are difficult to integrate during real-time operations in the cockpit, leading to altitude decisions that may not be fuel-optimal for new flight conditions.

Existing approaches are problematic in that, in practice, it is difficult for pilots to have sufficient support information in the cockpit to predict total trip fuel consumption impacts from altitude change decisions. In addition, current information does not provide an adequate time horizon for timing altitude change requests to air traffic control.

Embodiments of the present disclosure solve the problems associated with existing approaches. Embodiments provide a novel graphical representation of aircraft fuel efficiency in the cruise phase of operation. In stark contrast to existing approaches, embodiments include a display that provides pilots with additional information about fuel efficiency repercussions arising from tactical altitude, speed, and routing changes.

Embodiments include a display that aids pilots in altitude and speed selection decisions and negotiations with air traffic control.

Embodiments of the present disclosure have multiple advantages compared with existing approaches. Embodiments include an aircraft fuel efficiency tunnel display that provides graphical information to pilots in the cockpit. The displayed graphical information may include total trip fuel consumption projections for modified altitude profiles, allowing pilots to evaluate impacts from tactical altitude modifications. The displayed graphical information may provide broad context for the altitude targets provided with a flight plan, increasing pilot situational awareness during the cruise phase of flight. The graphical display may include trajectory optimization tools that provide a quantitative assessment of fuel consumption reduction potential and a graphical depiction of when altitude changes should be requested from air traffic control. As such, the graphical display provides pilots and air traffic controllers with additional look-ahead time to negotiate and plan modified altitude clearances, as compared with existing approaches.

In addition, embodiments are advantageous in that they have substantial commercial electronic decision-making aid for pilots. The display may be integrated into installed avionics or portable "electronic flight bag" systems. The display may exist as a stand-alone application or as a component of a larger suite of flight planning and weather functionality. In some embodiments, the display may be generated in static format and included in pre-flight planning documentation generated by flight dispatch specialists for pilots prior to departure.

As illustrated at least in FIGS. 1A-D, the present disclosure is directed to a novel system that enables a user interface to provide graphical display of aircraft fuel efficiency in the cruise phase of operation, or in advance, with the aircraft fuel efficiency display for use by a user to plan a vertical flight path. FIG. 1A is an aircraft cockpit view 102 from behind a pilot who is facing out through aircraft windows 104. As illustrated in FIG. 1A, a pilot or other user 150 may provide user input via information entry 160 to the graphical display 148, which provides for the aircraft fuel efficiency tunnel 108 display described above. An example part of the graphical display 148 is an aircraft efficiency tunnel 108 that allows the pilot to route efficiently through the flight path.

According to some embodiments, the aircraft fuel efficiency tunnels described herein (FIGS. 1A-B, efficiency tunnel 108, corresponding performance lines 254, 256, 264, 266 of FIG. 1D, tunnel 320 of FIG. 3) are not limited to being fuel efficiency tunnels, but may comprise isocontour tunnels of a desired objective function such as fuel efficiency, time cost, fuel cost, or another parameter known to one skilled in the art.

Figure 1B:
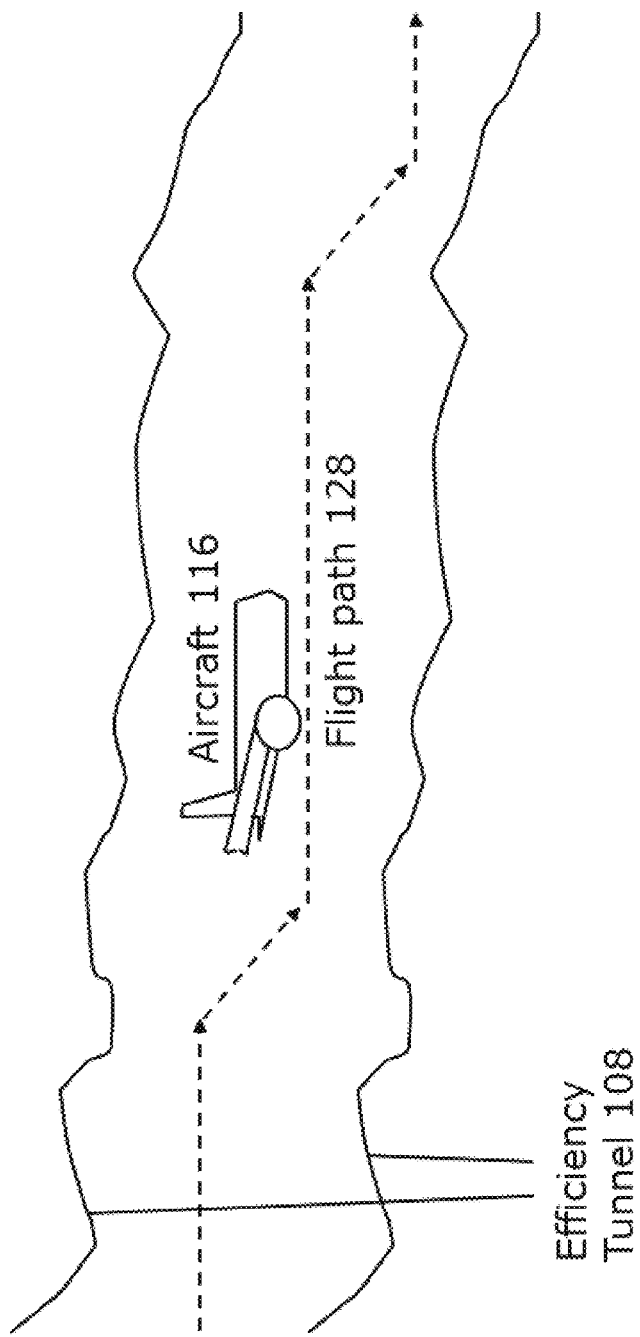
FIG. 1B is side view of an aircraft along a vertical efficiency tunnel of a flight path, according to embodiments of an apparatus employed by the present disclosure.

FIG. 1B is side view of an aircraft 116 along a vertical efficiency tunnel of 108 a flight path 128 that is taken through the actual fuel efficiency tunnel 108 represented on the graphical display 148. As illustrated in FIG. 1B, according to some embodiments, the flight path representation 128 spans the same distance as the altitude efficiency tunnel and follows a realistic aircraft altitude profile.

Figure 1C:
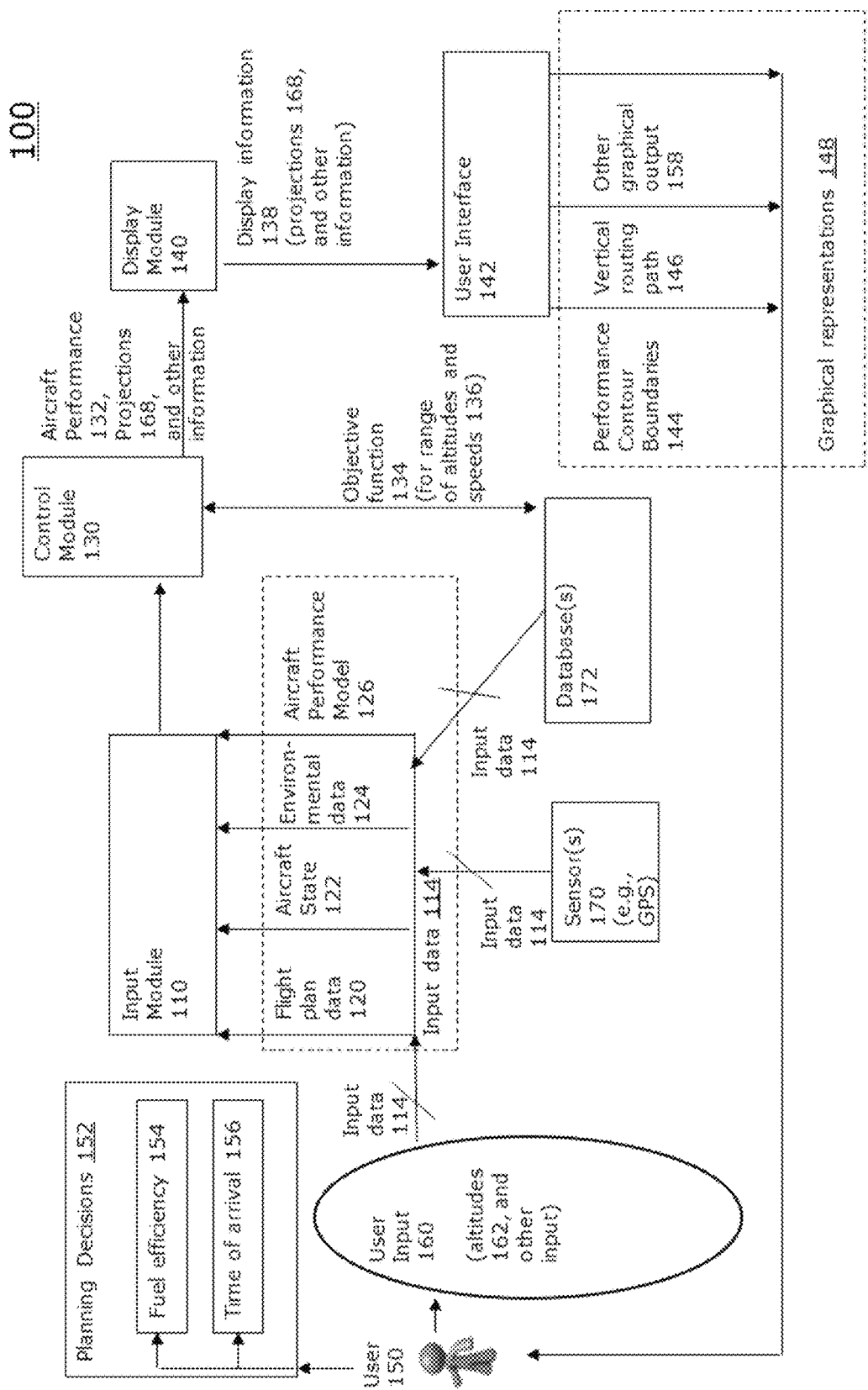
FIG. 1C is a high-level block diagram of an aircraft fuel efficiency tunnel display apparatus or system, according to embodiments of an apparatus employed by the present disclosure.

FIG. 1C is a high-level block diagram of an aircraft fuel efficiency tunnel display apparatus 100 or system, according to embodiments of an apparatus employed by the present disclosure. In some embodiments, the apparatus 100 includes an input module 110 configured to accept input data 114 related to an aircraft 116 (referring to the aircraft 116 of FIG. 1B). The apparatus 100 may provide the input data 114 by at least one of a sensor 170 such as a global positioning system (GPS), a database 172, and a user 150.

The input data 114 may include (i) flight plan data 120 that includes a flight path 128 (referring to the flight path 128 of FIG. 1B) of the aircraft, (ii) state 122 of the aircraft 116 along the flight path 128, (iii) environmental data 124, and (iv) an aircraft performance model 126 of the aircraft 116. The apparatus 100 includes a calculation module 130 configured to calculate aircraft performance 132 and an objective function 134 for a range of altitudes and speeds 136 as a function of the input data 114. The apparatus includes a display module 140 configured to send display information 138 to cause a user interface 142 to display aircraft performance contour boundaries 144 and a vertical routing path 146 that meets the objective function 134 to provide graphical representations 148 to support a user's planning decisions 152 of fuel efficiency 154 of the aircraft versus time of arrival 156 of the aircraft 116 along the flight path 128. The display module 140 may also display other graphical output 158 to the user 150 via graphical representations 148.

Some embodiments enable updating not just during pre-planning but also during the flight. In some embodiments, the apparatus 100 may accept an input 160 of the user 150 along the flight path, and update the aircraft performance model 126 based on the input data 114 associated with the user input 160.

Some embodiments provide additional flexibility and more options for the pilot. In some embodiments, the apparatus 100 may enable the user 150 to specify, as the user input 160, one or more altitudes 162 within the range of altitudes for one or more segments of the flight path 128.

Some embodiments are capable of enabling planning for the pilot with complex, specific, or specialized data. In some embodiments, the apparatus 100 may include at least one of the following: the state 122 of the aircraft along the flight path 128 that includes at least one of a position, altitude, and speed of the aircraft; the environmental data 126 that may include at least one of a wind, temperature, and weather condition; and the aircraft performance model 126 that may include at least one of: type of the aircraft, planned flight path, aircraft altitude, speed of the aircraft, weight of the aircraft that dynamically changes along the flight path, aircraft weight center of gravity, wind and temperature data that dynamically changes along the planned flight path, fuel burn versus altitude, fuel burn versus Mach number, fuel burn versus cost index, cost index, current recommended trajectory step constraint, and step climb constraints considering the airspace to be traversed along the planned flight path.

Some embodiments provide additional information to the graphical user interface to enable the pilot to react to sudden changes in conditions, thereby improving situational awareness and improving safety and comfort of the pilot and any passengers throughout the flight. In some embodiments, the apparatus 100 may cause the user interface 142 to display additional information 158, including at least one of weather, atmospheric turbulence, aircraft traffic, terrain information, and maximum altitude of the aircraft based on aircraft weight and atmospheric conditions.

Pilots can select a more efficient (e.g., optimal or improved) flight path based upon the efficiency tunnel 108. As such, in some embodiments, the apparatus 100 may calculate, by the control module 130, projections 168 of the aircraft performance along the flight path 128, during which at least a portion of the flight path 128 is between the aircraft performance contour boundaries 144, and wherein the display module 140 is further configured to display the projections 168 of the aircraft performance 132 along the flight path.

In addition to providing dynamic flight planning, some embodiments are capable of pre-planning a flight. In some embodiments, the apparatus 100 may perform the functions of accepting, calculating, and causing in advance of the aircraft's commencing the flight along the flight path 128.

Some embodiments provide a smoother flight, even when changes such as speed or altitude occur, by reducing changes to the flight path, thereby improving safety and comfort of the pilot and any passengers throughout the flight. In some embodiments, the apparatus 100 may apply a constant flight path state 122 for a given time or distance following a change of altitude or speed by the aircraft 116.

Some embodiments react to sudden changes in conditions and provide an improved model for the pilot, thereby improving situational awareness and improving safety and comfort of the pilot and any passengers throughout the flight. As such, in some embodiments, the apparatus 100 may calculate the aircraft performance 132 using a dynamically changing aircraft performance model 126. In some embodiments, the apparatus 100 may change the aircraft performance model 126 dynamically based on a change of the input data 114.

According to some embodiments, as illustrated in FIG. 1C, data sources for weather, aircraft weight, and planned flight route may vary (e.g., be provided by a user 150, sensor 170, database 172, or other means known to one skilled in the art) depending on aircraft connectivity and cockpit integration with the tunnel display. Components of the user interface display 142 may include one or more of the following: (1) a visual depiction 148 of the minimum and maximum altitude boundaries for the 98% and 99% optimal tunnels (including but not limited to optimal fuel efficiency tunnels, other optimal tunnels that are optimized based on an objective function including but not limited to fuel efficiency, isocontour tunnels of a desired objective function, or other tunnels known to one skilled in the art) based on planned route of flight; (2) an input 126 for current aircraft speed or cost index; (3) input 120 for modifications to assumed lateral flight plan (latitude/longitude or waypoint/airway designation); (4) a depiction 148 of current aircraft position; 122 (5) a visual representation 148 of the most up-to-date planned altitude profile for a flight, including scheduled climbs and descents; (6) a numerical representation 148 of: (a) expected fuel consumption 126 based on the planned altitude profile, and (b) expected flight time 126 based on the planned altitude profile; (7) a visual representation of a modified altitude profile 126 or multiple modified altitude profiles 126; (8) a numerical representation 148 of (a) expected fuel consumption 126 for each modified altitude profile, and (b) expected flight time 126 for each modified altitude profile.

Figure 1D:
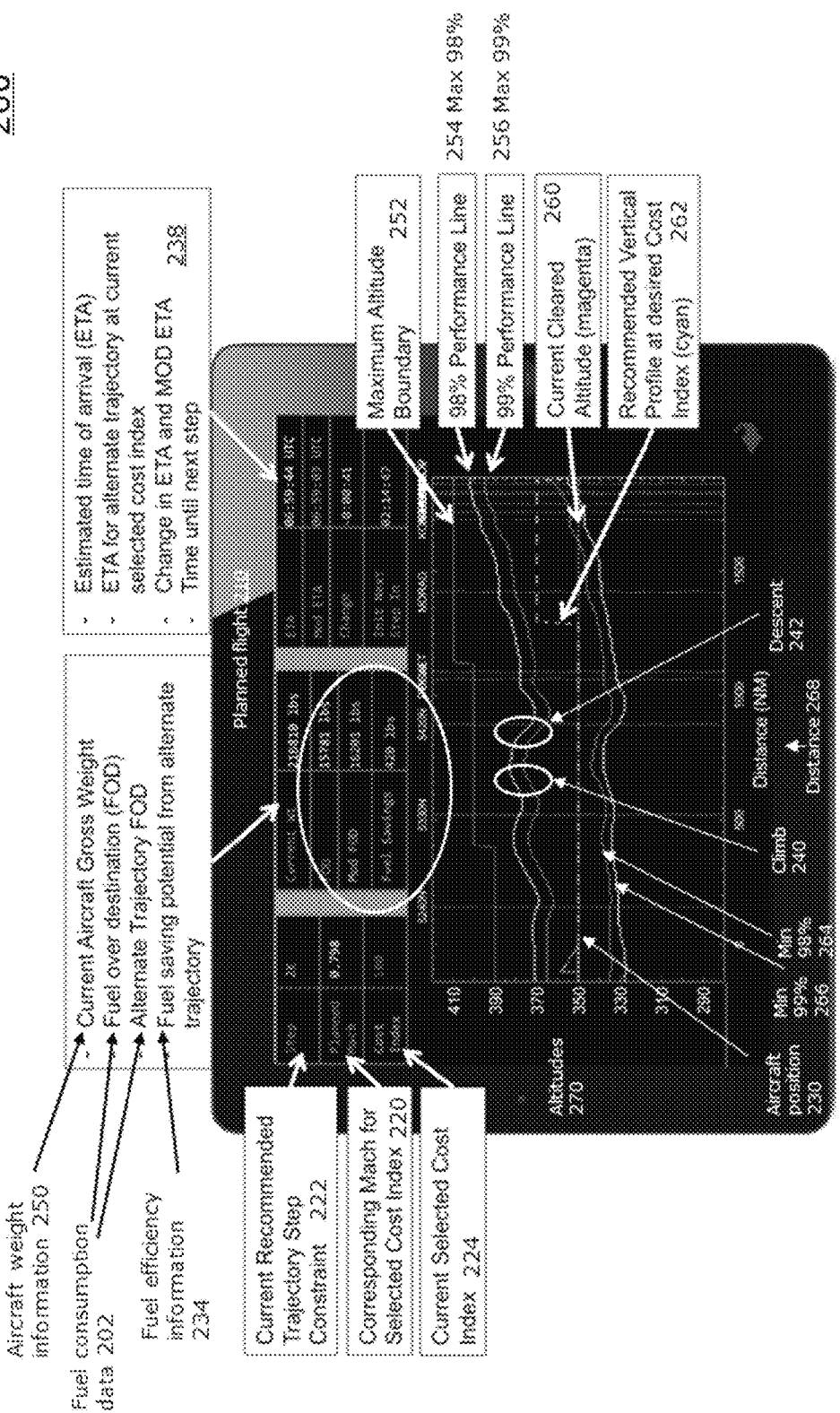
FIG. 1D is an example aircraft fuel efficiency tunnel display, according to embodiments of an apparatus employed by the present disclosure.

FIG. 1D is an example aircraft fuel efficiency tunnel display, according to some embodiments of an apparatus 200 employed by the present disclosure. The representation in FIG. 1D shows a side view of a flight plan 200 overlaid with fuel efficiency information 234 calculated using weather observations and forecasts, aircraft weight information 250, and fuel consumption data 202 for the aircraft at different altitudes 270 throughout a planned flight 210.

According to some embodiments, the display 200 aids users such as pilots in altitude 270 and speed 220 selection decisions and negotiations with air traffic control. Flights may be planned prior to departure by aircraft flight dispatchers using specialty software and operational expertise. Pilots may be given a planned route (including altitude 270 in hundreds of feet, distance 268 in nautical miles, and speed 220 targets) based on this pre-flight planning process. Wind information for the planned route of flight may be loaded into the aircraft flight management system (FMS) onboard the aircraft. Once a flight is airborne, one or more of weather conditions, turbulence, air traffic control constraints, and other factors may cause changes in the original planned altitude 270 or route. The display 200 of FIG. 2 may provide pilots with additional information about fuel efficiency repercussions arising from tactical altitude 270, speed 220, and routing changes. The representation 200 may also be useful for aircraft flight dispatchers for initial development of flight plans 210 as well as for ground-based assistance with dynamic rerouting of flights once airborne.

According to some embodiments, as illustrated in FIG. 1D, data sources for weather, aircraft weight 250, and planned flight route 210 may vary (e.g., be provided by a user, sensor, database, or other means known to one skilled in the art) depending on aircraft connectivity and cockpit integration with the tunnel display. Components of the display 200 may include one or more of the following: (1) a visual depiction 200 of the minimum altitude boundaries for the 98% (element 264) and 99% (element 266) optimal tunnels (including but not limited to optimal fuel efficiency tunnels, other optimal tunnels that are optimized based on an objective function including but not limited to fuel efficiency, isocontour tunnels of a desired objective function, or other tunnels known to one skilled in the art) and maximum altitude boundaries for the 98% (element 254) and 99% (element 256) optimal fuel efficiency tunnels based on planned route 210 of flight; (2) an input for current aircraft speed 220 or cost index 224; (3) input for modifications 222 to assumed lateral flight plan (latitude/longitude or waypoint/airway designation); (4) a depiction of current aircraft position 230; (5) a visual representation 200 of the most up-to-date planned altitude profile for a flight, including scheduled climbs 240 and descents 242; (6) a numerical representation of: (a) expected fuel consumption 202 based on the planned altitude profile, and (b) expected flight time 238 based on the planned altitude profile; (7) a visual representation of a modified altitude profile 262 or multiple modified altitude profiles; (8) a numerical representation of (a) expected fuel consumption 202 for each modified altitude profile, and (b) expected flight time 238 for each modified altitude profile. The display 200 of FIG. 1D may also provide a maximum altitude boundary 252, a current cleared altitude 260 and a recommended vertical profile at a desired cost index 262.

Figure 2:
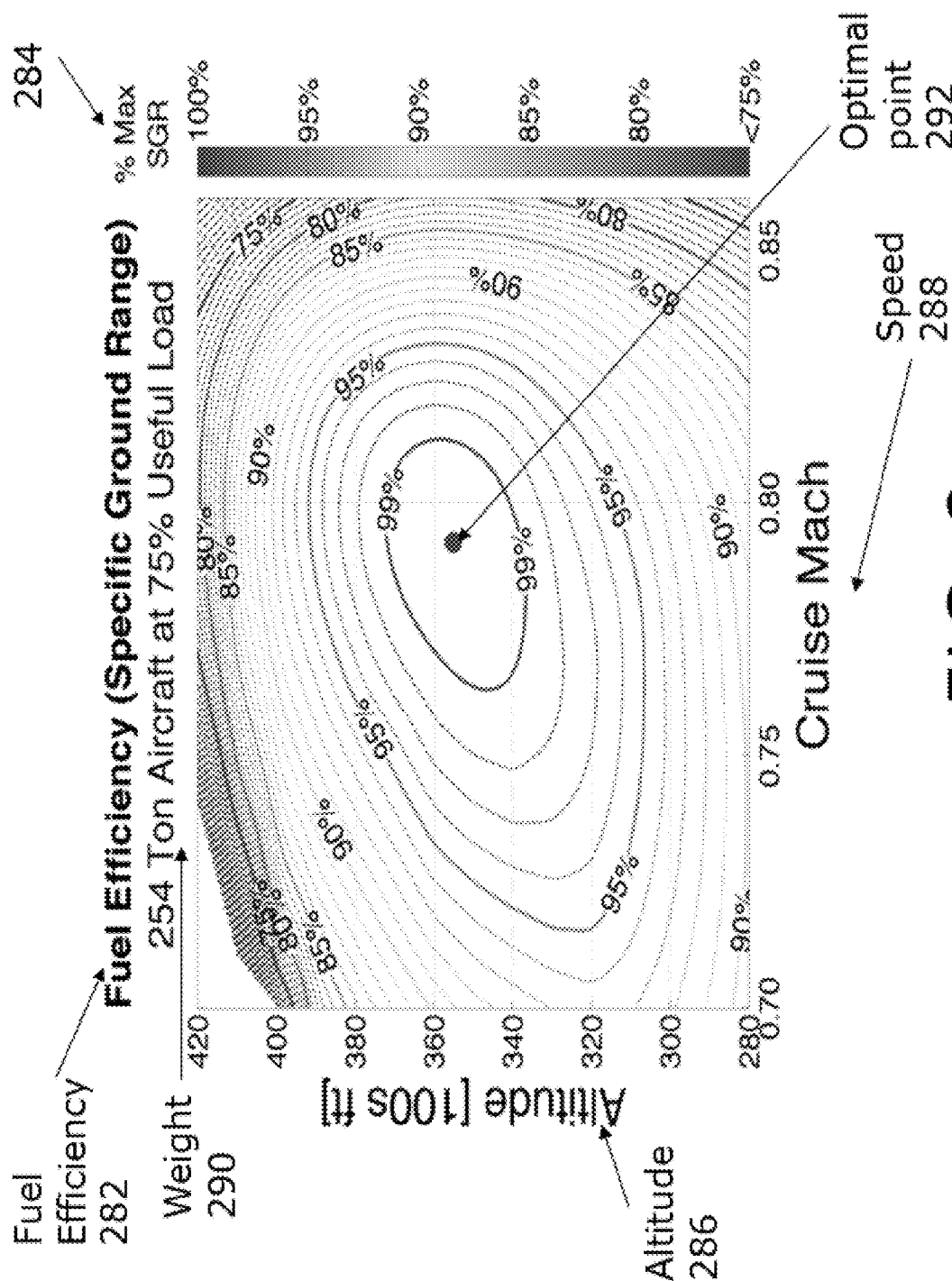
FIG. 2 is a graph of instantaneous fuel efficiency of a typical long-haul aircraft at a fixed weight, according to embodiments of an apparatus employed by the present disclosure.

FIG. 2 is a graph of instantaneous fuel efficiency of a typical long-haul aircraft at a fixed weight 290 (calm winds, standard atmosphere), according to embodiments of an apparatus 270 employed by the present disclosure. The fuel efficiency of an aircraft at any point along its flight path may be a function of one or more of weight, altitude, speed, wind, temperature, and other second-order effects. At a fixed weight 290, there exists a combination of speed and altitude at which instantaneous fuel efficiency is maximized 284, as shown in FIG. 2 for a typical wide-body long-range aircraft. As a flight progresses, there is an optimal sequence of speeds and altitudes to minimize fuel consumption. The speed 288 and altitude 286 at which aircraft are actually flown may differ from this optimal point 292 for a variety of operational and practical reasons. One of these reasons is a lack of sufficient fuel efficiency information available to pilots in the cockpit.

As illustrated in FIG. 2, for a given cruise speed 288 and weight 290, the instantaneous fuel efficiency 282 at each altitude 286 along the route of flight can be calculated in one-minute intervals. Longer or shorter time periods or set distances may also be used to discretize the flight depending on desired computation time and display resolution.

Figure 3:
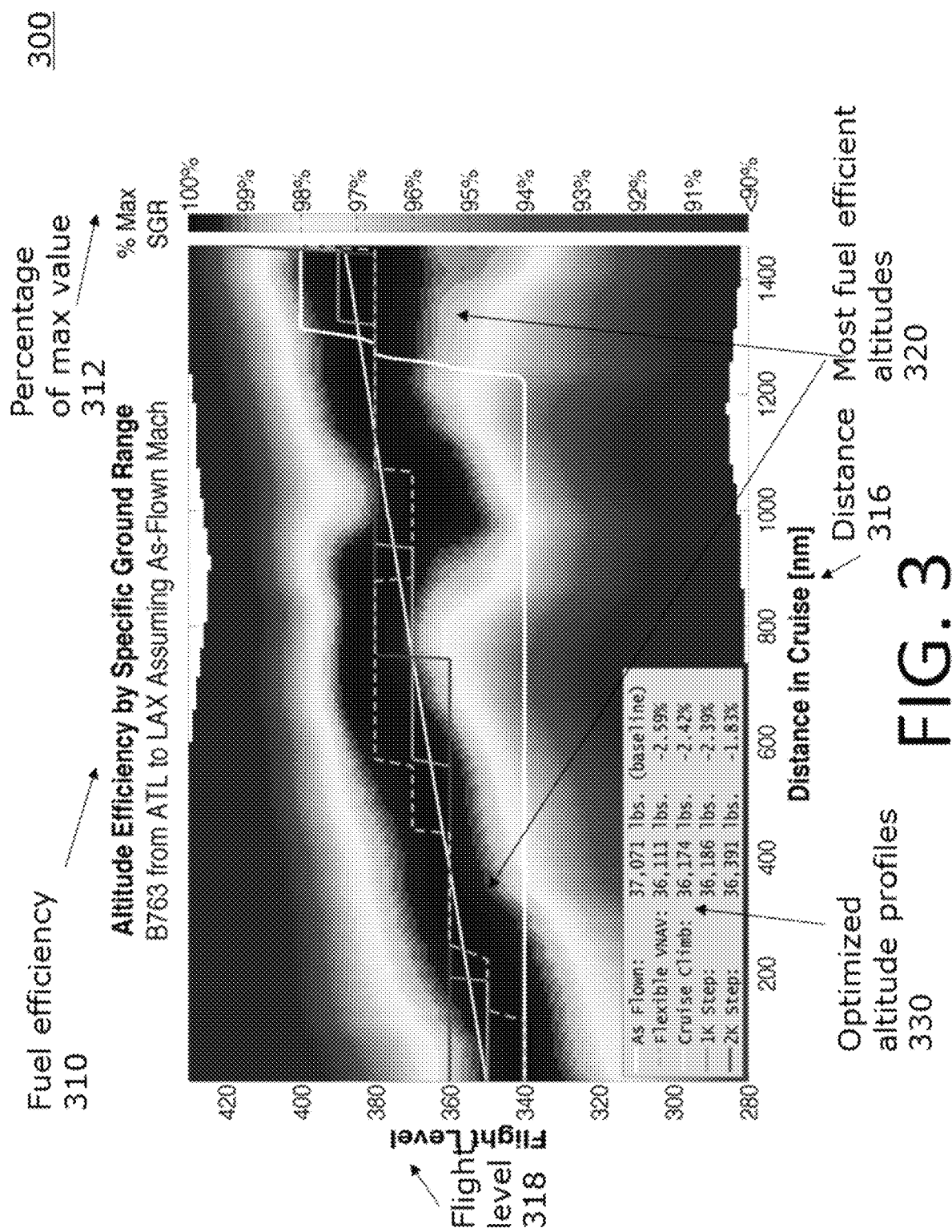
FIG. 3 is a graph of heat map illustrating fuel efficiency as a percentage of the maximum-achievable value at every point in a cruise trajectory, according to embodiments of an apparatus described in the present disclosure.

FIG. 3 is a graph of heat map display 300 illustrating fuel efficiency 310 as a percentage of the maximum-achievable value 312 at every point in a cruise trajectory, according to embodiments of an apparatus described in the present disclosure.

The heat map display 300 in FIG. 3 fuel efficiency 310 as a percentage of the maximum-achievable value 312 at every point in the cruise trajectory (collectively, the flight level 318 and the distance in cruise 316). In FIG. 3, the background colors indicate fuel efficiency 310 in nautical miles over the ground per pound of fuel, or Specific Ground Range (SGR). This metric is analogous to Miles per Gallon in a car. The blue "tunnel" 320 indicates the band of altitudes that are projected to be the most fuel efficient for the flight given updated weather forecasts and weight estimates. Optimized altitude profiles 330 are then generated using the altitude efficiency tunnel and compared to the planned route in terms of flight time and fuel consumption. These optimized profiles 330 are also provided on the heat map display 300. In other words, according to some embodiments, FIG. 3 depicts an altitude efficiency "tunnel" heat map 300 showing fuel efficiency 310 variation through the cruise phase of an example flight, along with planned and optimized 330 altitude trajectories generated with one or more optimization algorithms.

According to some embodiments, the visualization 300 in FIG. 3 illustrates some example considerations in planning optimal altitude profiles including one or more of the following: (i) optimal altitude may fluctuate due to wind and temperature changes along the route of flight—in some cases, lower altitudes may be more efficient than higher altitudes due to specific wind and temperature conditions; (ii) the range of altitudes where efficiency is greater than 99% may form an optimal "tunnel," appearing in the heat map 300 as the dark blue region 320—the width of this tunnel 320 may depend on at least one of the aircraft type and atmospheric conditions; (iii) fuel efficiency may fall off significantly as altitudes become farther from optimal. In this example, an altitude deviation 2000 feet (ft) below optimal may cause a 3% efficiency loss. A larger deviation of 6000 ft may cause an efficiency loss of more than 10%. Such deviations may be encountered in actual operations on account of ride quality or congestion.

Figure 4:
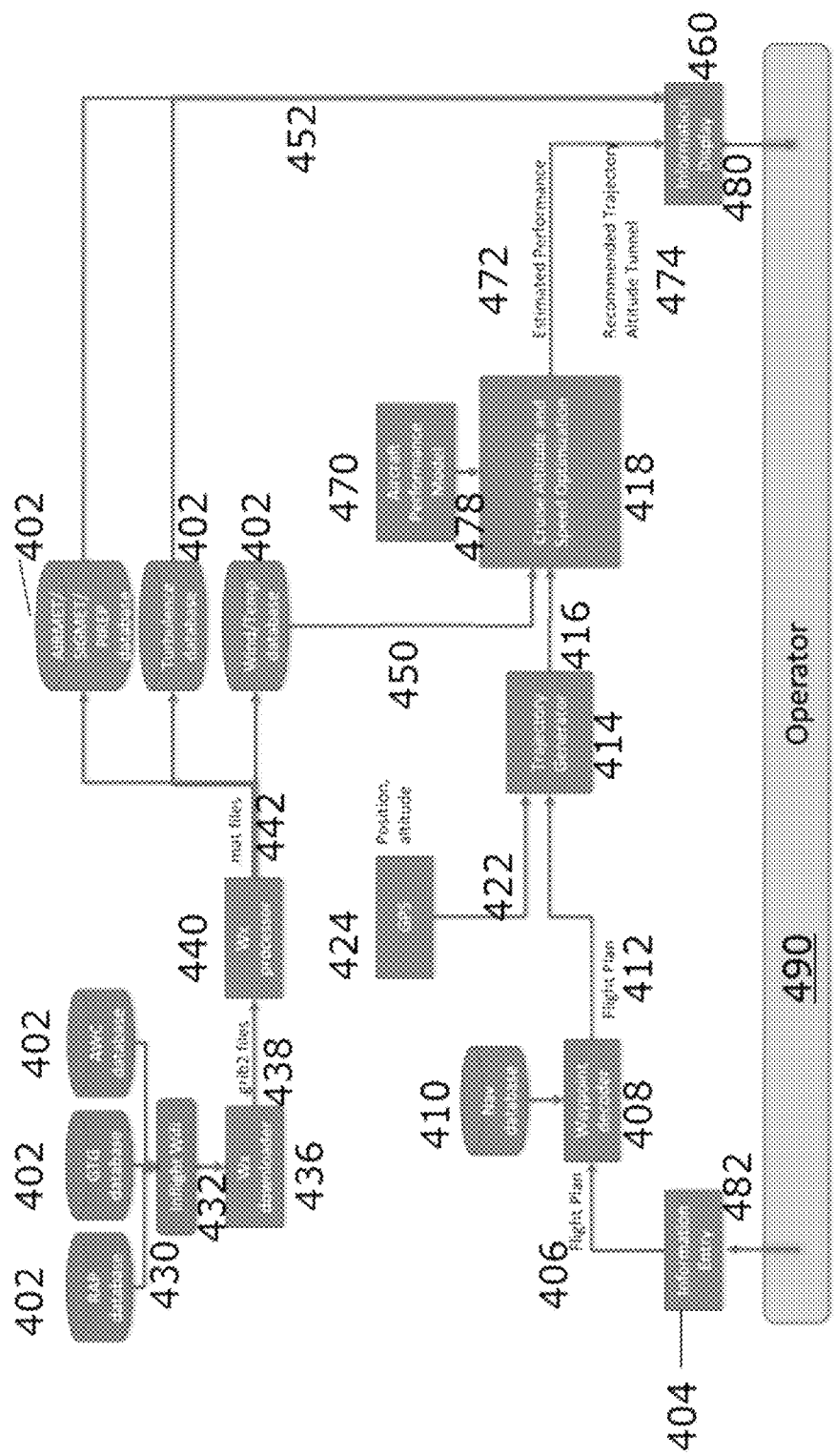
FIG. 4 a high-level architecture diagram, according to embodiments of an apparatus employed by the present disclosure.

FIG. 4 a high-level architecture diagram, according to embodiments of an apparatus employed by the present disclosure. According to some embodiments, FIG. 4 represents an architecture 400 for generating aircraft fuel efficiency tunnels.

According to some embodiments, as illustrated in FIG. 4, one or more users 490 may provide information 482 via an information entry module 404. The user-provided information 482 may include a flight plan 406 that is forwarded by the information entry module 404 into a waypoint decoder 408. A database 410 may also provide flight plan information to the waypoint decoder 408, and the waypoint decoder 408 may output the aggregate flight plan information 412 into a trajectory generator 414. The trajectory generator 414 may also receive GPS information 422 from a GPS 424. The received GPS information 422 may include but not limited to include aircraft position and altitude. The trajectory generator 414 may provide a trajectory 416 to a cruise altitude and speed optimization module 418.

At least one of one or more databases 402 and an inflight wireless module 430 may provide information including but not limited to weather information 432 to a weather downloader 436 which provides downloaded weather information 438 to a weather processor 440. The weather processor 440 provides processed weather information 442 to one or more databases 402. In turn, at least one of the one or more databases 402 may provide wind and turbulence information 450 to the cruise altitude and speed optimization module 418. At least one of the one or more databases 402 may also provide other weather information 452 including but not limited to including turbulence and other types of weather information to the information display module 460. An aircraft performance model 470 may provide aircraft performance model information 478 to the cruise altitude and speed optimization module 418. The cruise altitude and speed optimization module 418 may provide performance information including but not limited to one or more of estimated performance information 472 and recommended trajectory altitude tunnel information 474 to the information display module 460. The information display module 460 may provide graphical representation information 480 to one or more users 490.

Figure 7:
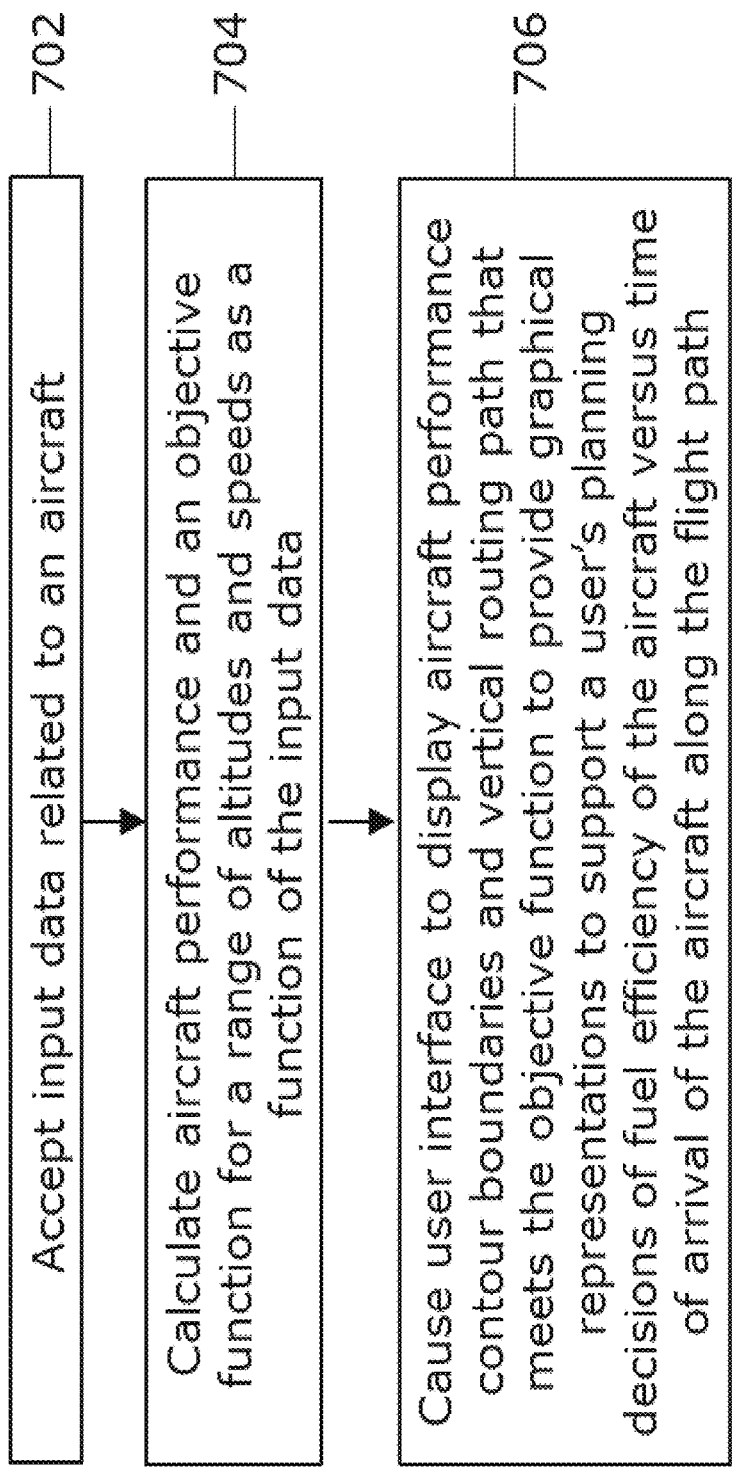
FIG. 7 is a flow diagram illustrating an example embodiment of a method of the present disclosure.

FIG. 7 is a flow diagram illustrating an example embodiment of a method of the present disclosure. As illustrated in FIG. 7, in some embodiments, a method 700 accepts input data related to an aircraft (702). The input data may include: (i) flight plan data that includes a flight path of the aircraft, (ii) state of the aircraft along the flight path, (iii) environmental data, and (iv) an aircraft performance model of the aircraft. The method 700 calculates aircraft performance and an objective function for a range of altitudes and speeds as a function of the input data (704). The method 700 causes a user interface to display aircraft performance contour boundaries and a vertical routing path that meets the objective function to provide graphical representations to support a user's planning decisions of fuel efficiency of the aircraft versus time of arrival of the aircraft along the flight path (706).

Figure 8:
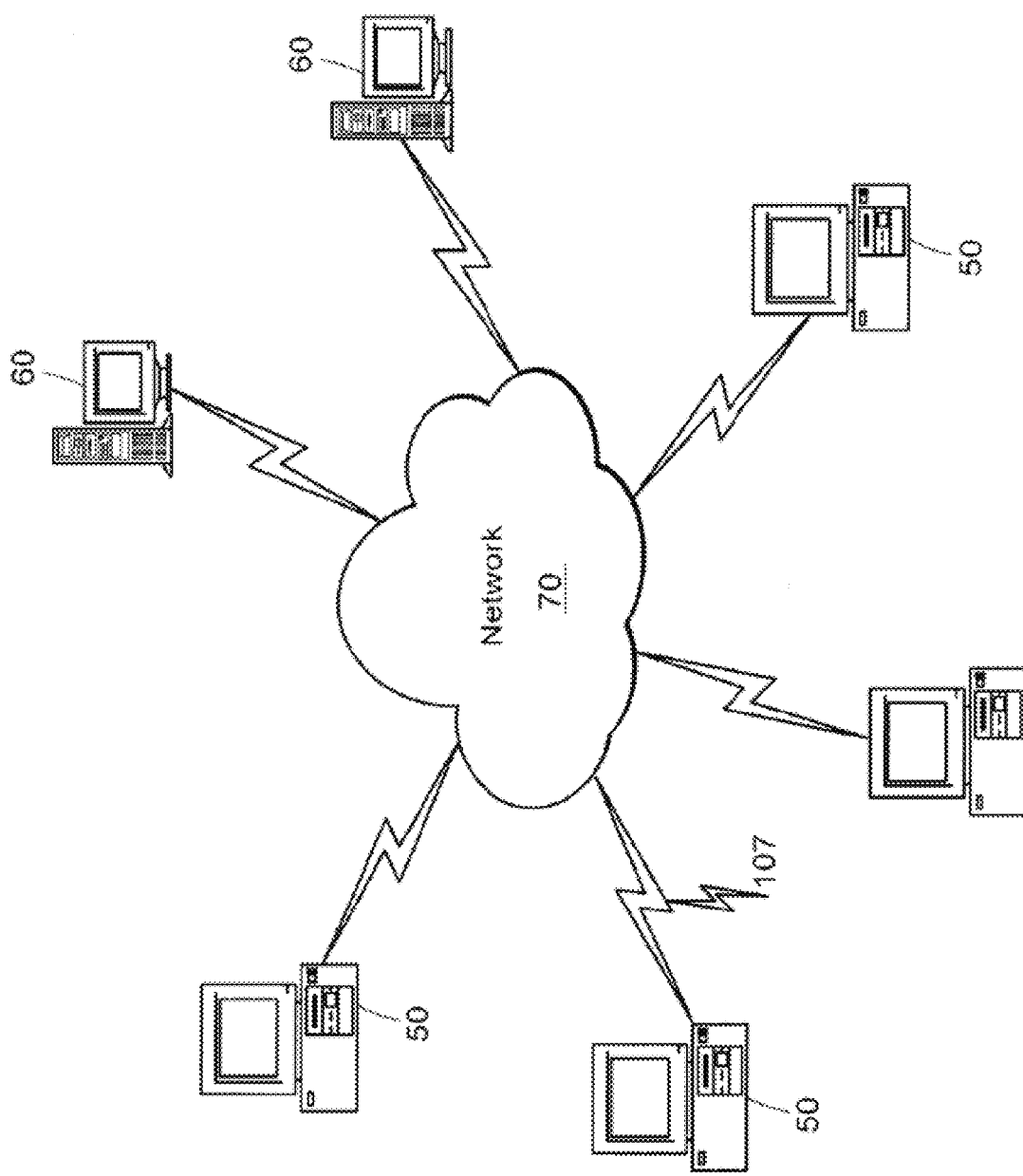
FIG. 8 is a network diagram that illustrates a computer network or similar digital processing environment in which embodiments of the present disclosure may be implemented.

FIG. 8 is a network diagram that illustrates a computer network or similar digital processing environment 800 in which embodiments of the present disclosure may be implemented. Client computer(s)/devices 50 (e.g., computing devices/display devices) and server computer(s) 60 (e.g., a Cloud-based service) provide processing, storage, and input/output devices executing application programs and the like. The client computer(s)/devices 50 (e.g., computing devices/display devices) can also be linked through communications network 70 to other computing devices, including other client devices/processes 50 and server computer(s) 60. The communications network 70 can be part of a remote access network, a global network (e.g., the Internet), a worldwide collection of computers, local area or wide area networks, and gateways that currently use respective protocols (TCP/IP, BLUETOOTH™, etc.) to communicate with one another. Other electronic device/computer network architectures are suitable. According to some embodiments, processing may be performed centrally, and data entry and display may be performed in distributed locations (i.e., at each aircraft).

Figure 9:
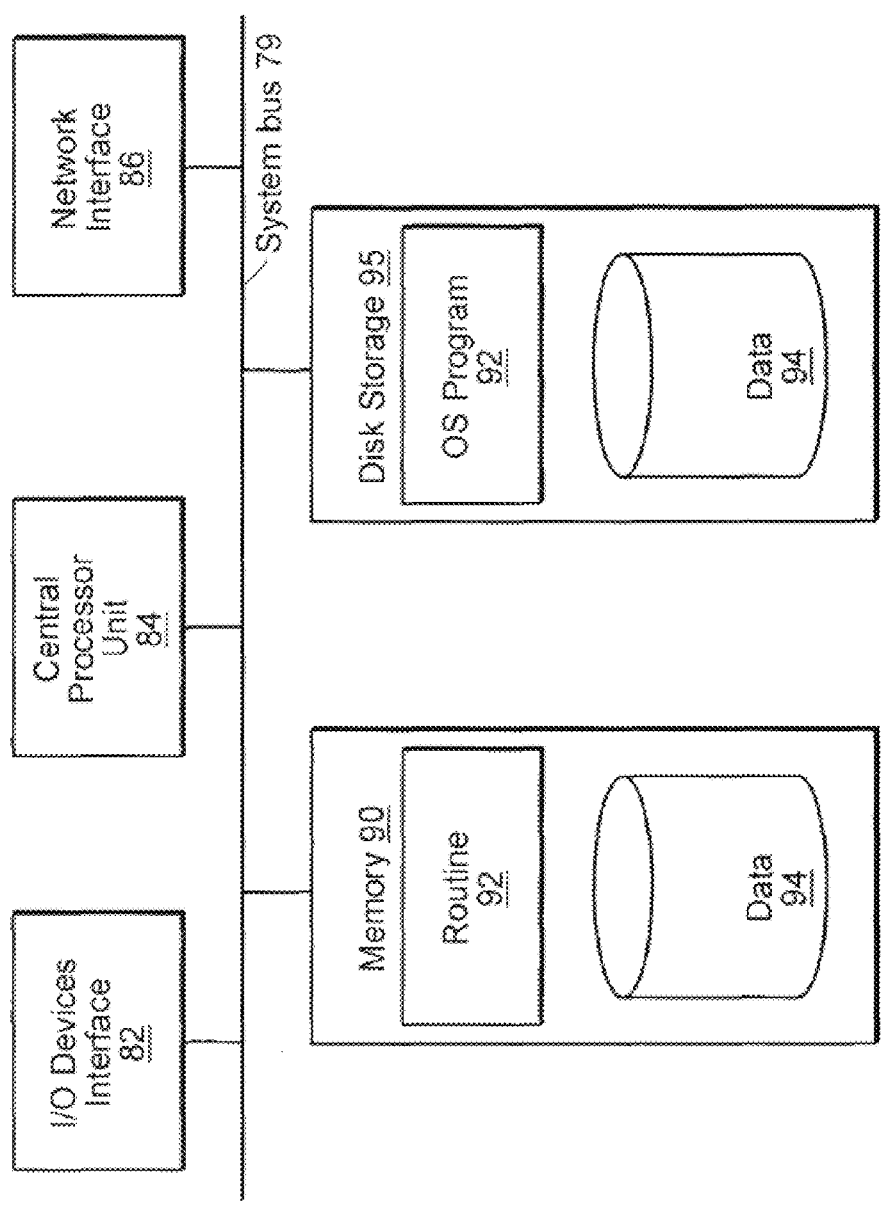
FIG. 9 is a block diagram of an example internal structure of a computer (e.g., client processor/device or server computers) in the computer system or apparatus of FIG. 8, according to some embodiments.

FIG. 9 is a block diagram of an example internal structure of a computer (e.g., client processor/device 50 or server computers 60) in the computer system or apparatus of FIG. 8. Each computer 50, 60 includes a system bus 79, where a bus is a set of hardware lines used for data transfer among the components (e.g., entities) of a computer or processing system or apparatus. The system bus 79 is essentially a shared conduit that connects different elements of a computer system or apparatus (e.g., processor, disk storage, memory, input/output ports, network ports, etc.) that enables the transfer of information between the elements. Attached to the system bus 79 is an I/O device interface 82 for connecting various input and output devices (e.g., keyboard, mouse, displays, printers, speakers, touchscreen etc.) to the computer 50, 60. A network interface 86 allows the computer to connect to various other devices attached to a network (e.g., network 70 of FIG. 8). Memory 90 provides volatile storage for computer software instructions 92 and data 94 used to implement embodiments 100, 200, 270, 300, 600, 700 of the present disclosure (e.g., including but not limited to including any of the input module, calculation module, display module, processor, memory, or any other device, engine, system, module, or controller described herein). Disk storage 95 provides non-volatile storage for computer software instructions 92 and data 94 used to implement some embodiments of the present disclosure. Note, data 94 may be the same between a client 50 and server 60, however, the type of computer software instructions 92 may differ between a client 50 and a server 60. A central processor unit 84 is also attached to the system bus 79 and provides for the execution of computer instructions.

As illustrated in FIG. 9, in an embodiment, the system or apparatus 900 includes a processor 84 and a memory 90 with computer code instructions stored therein. The memory 90 is operatively coupled to the processor 84 such that the computer code instructions configure the processor 84 to implement an input module, a calculation module, and a display module. The input module may be configured to accept input data related to an aircraft. The input data may include (i) flight plan data that includes a flight path of the aircraft, (ii) state of the aircraft along the flight path, (iii) environmental data, and (iv) an aircraft performance model of the aircraft. The calculation module may be configured to calculate aircraft performance and an objective function for a range of altitudes and speeds as a function of the input data. The display module may be configured to cause a user interface, via the I/O device interface 82, to display aircraft performance contour boundaries and a vertical routing path that meets the objective function to provide graphical representations to support a user's planning decisions of fuel efficiency of the aircraft versus time of arrival of the aircraft along the flight path.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the disclosure system. Computer program product 92 may be installed by any suitable software installation procedure, as is well known in the art. In another embodiment, at least a portion of the software instructions may also be downloaded over a cable, communication or wireless connection. In other embodiments, the disclosure programs are a computer program propagated signal product 107 (shown in FIG. 8) embodied on a propagated signal on a propagation medium (e.g., a radio wave, an infrared wave, a laser wave, a sound wave, or an electrical wave propagated over a global network such as the Internet, or other network(s)). Such carrier medium or signals may be employed to provide at least a portion of the software instructions for the present disclosure routines/program 92.

In addition, alternative embodiments herein support an automatic pilot control system or automatic aircraft control system, in addition to the user-controlled (manual) control system. Such embodiments include an automatic aircraft control system.

Further, some embodiments herein are directed to the particular application of monitoring aircraft fuel efficiency for a vertical routing path, and are directed to a specific method of providing an improved graphical user display.

Embodiments or aspects thereof may be implemented in the form of hardware (including but not limited to hardware circuitry), firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, hardware, firmware, software, routines, or instructions may be described herein as performing certain actions or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, or some combination thereof, and, thus, the data processors described herein are intended for purposes of illustration only and not as a limitation of the embodiments.

While this disclosure has been particularly shown and described with references to example embodiments thereof, it will be understood by those skilled in the art that various changes in form and details may be made therein without departing from the scope of the disclosure encompassed by the appended claims.

Some embodiments may provide one or more technical advantages that may transform the behavior or data, provide functional improvements, or solve a technical problem. In some embodiments, technical advantages or functional improvements may include but are not limited to the improvement of providing a more efficient an aircraft fuel efficiency tunnel display that provides graphical information to pilots in the cockpit. The displayed graphical information may include total trip fuel consumption projections for modified altitude profiles, allowing pilots to evaluate impacts, and thereby improve performance of the aircraft, from tactical altitude modifications. The displayed graphical information may provide broad context for the altitude targets provided with a flight plan, increasing pilot situational awareness during the cruise phase of flight. The graphical display may include trajectory optimization tools that provide a quantitative assessment of fuel consumption reduction potential and a graphical depiction of when altitude changes should be requested from air traffic control, each of which improves the performance and efficiency of the graphical display. As such, the graphical display provides pilots and air traffic controllers with additional look-ahead time to negotiate and plan modified altitude clearances, as compared with existing approaches. Thus, embodiments improve the efficiency, accuracy, speed or other effects compared to the existing methods.

In addition, embodiments provide one or more technical advantages in that they are advantageous in that they have substantial commercial electronic decision-making aid for pilots. The display may be integrated into installed avionics or portable "electronic flight bag" systems. The display may exist as a stand-alone application or as a component of a larger suite of flight planning and weather functionality.

Some embodiments solve a technical problem, thereby providing a technical effect, by one or more of the following. Some embodiments may solve a technical problem, thereby providing a technical effect, by providing an improved aircraft fuel efficiency tunnel display that provides graphical information to pilots in the cockpit. The displayed graphical information may include total trip fuel consumption projections for modified altitude profiles, allowing pilots to evaluate impacts, and thereby improve performance of the aircraft, from tactical altitude modifications. The displayed graphical information may provide broad context for the altitude targets provided with a flight plan, increasing pilot situational awareness during the cruise phase of flight. The graphical display may include trajectory optimization tools that provide a quantitative assessment of fuel consumption reduction potential and a graphical depiction of when altitude changes should be requested from air traffic control, each of which improves the performance and efficiency of the graphical display. As such, the graphical display provides pilots and air traffic controllers with additional look-ahead time to negotiate and plan modified altitude clearances, as compared with existing approaches. Thus, embodiments improve the efficiency, accuracy, speed or other effects compared to the existing methods.

In addition, embodiments solve a technical problem, thereby providing a technical effect, by providing substantial commercial electronic decision-making aid for pilots. The display may be integrated into installed avionics or portable "electronic flight bag" systems. The display may exist as a stand-alone application or as a component of a larger suite of flight planning and weather functionality.

What is claimed is:

1. A flight planning decision support apparatus, comprising:
   an input module configured to accept input data related to an aircraft, the input data including (i) flight plan data that includes a flight path of the aircraft, (ii) state of the aircraft along the flight path, (iii) environmental data, and (iv) an aircraft performance model of the aircraft;
   a calculation module configured to calculate aircraft performance and an objective function for a range of altitudes and speeds as a function of the input data; and
   a display module configured to cause a user interface to display, over the range of altitudes and speeds, aircraft performance contour boundaries and a vertical routing path that meets the objective function to provide graphical representations to support a user's planning decisions of fuel efficiency of the aircraft versus time of arrival of the aircraft along the flight path, the user's planning decisions including selections of altitudes or speeds from the range of altitudes and speeds.

2. The apparatus of claim 1, wherein the input module is further configured to accept an input of the user along the flight path, and the calculation module is further configured to update the aircraft performance model based on the input data associated with the user input.

3. The apparatus of claim 2, wherein the calculation module is further configured to enable the user to specify, as the user input, one or more altitudes within the range of altitudes for one or more segments of the flight path.

4. The apparatus of claim 1, wherein at least one of:
   the state of the aircraft along the flight path includes at least one of a position, altitude, and speed of the aircraft;
   the environmental data includes at least one of a wind, temperature, and weather condition; and
   the aircraft performance model includes at least one of: type of the aircraft, planned flight path, aircraft altitude, speed of the aircraft, weight of the aircraft that dynamically changes along the flight path, aircraft weight center of gravity, wind and temperature data that dynamically changes along the planned flight path, fuel burn versus altitude, fuel burn versus Mach number, fuel burn versus cost index, cost index, current recommended trajectory step constraint, and step climb constraints considering the airspace to be traversed along the planned flight path.

5. The apparatus of claim 1, wherein the display module is further configured to cause the user interface to display additional information, including at least one of weather, atmospheric turbulence, aircraft traffic, terrain information, and maximum altitude of the aircraft based on aircraft weight and atmospheric conditions.

6. The apparatus of claim 1, wherein the calculation module is further configured to calculate projections of the aircraft performance along the flight path, during which at least a portion of the flight path is between the aircraft performance contour boundaries, and wherein the display module is further configured to display the projections of the aircraft performance along the flight path.

7. The apparatus of claim 1, wherein the input module, calculation module, and display module are configured to perform their respective functions in advance of the aircraft's commencing the flight along the flight path.

8. The apparatus of claim 1, wherein the calculation module is further configured to apply a constant aircraft flight path state for a given time or distance following a change of altitude or speed by the aircraft.

9. The apparatus of claim 1, wherein the calculation module is further configured to calculate the aircraft performance using a dynamically changing aircraft performance model.

10. The apparatus of claim 9, wherein the calculation module is still further configured to change the aircraft performance model dynamically based on a change of the input data.

11. A flight planning decision support method, comprising:
    accepting input data related to an aircraft, the input data including (i) flight plan data that includes a flight path of the aircraft, (ii) state of the aircraft along the flight path, (iii) environmental data, and (iv) an aircraft performance model of the aircraft;
    calculating aircraft performance and an objective function for a range of altitudes and speeds as a function of the input data; and
    causing a user interface to display, over the range of altitudes and speeds, aircraft performance contour boundaries and a vertical routing path that meets the objective function to provide graphical representations to support a user's planning decisions of fuel efficiency of the aircraft versus time of arrival of the aircraft along the flight path, the user's planning decisions including selections of altitudes or speeds from the range of altitudes and speeds.

12. The method of claim 11, further comprising accepting an input of the user along the flight path, and updating the aircraft performance model based on the input data associated with the user input.

13. The method of claim 11, further comprising enabling the user to specify, as the user input, one or more altitudes within the range of altitudes for one or more segments of the flight path.

14. The method of claim 11, wherein at least one of:
    the state of the aircraft along the flight path includes at least one of a position, altitude, and speed of the aircraft;
    the environmental data includes at least one of a wind, temperature, and weather condition; and
    the aircraft performance model includes at least one of: type of the aircraft, planned flight path, aircraft altitude, speed of the aircraft, weight of the aircraft that dynamically changes along the flight path, aircraft weight center of gravity, wind and temperature data that dynamically changes along the planned flight path, fuel burn versus altitude, fuel burn versus Mach number, fuel burn versus cost index, cost index, current recommended trajectory step constraint, and step climb constraints considering the airspace to be traversed along the planned flight path.

15. The method of claim 11, further comprising causing the user interface to display additional information, including at least one of weather, atmospheric turbulence, aircraft traffic, terrain information, and maximum altitude of the aircraft based on aircraft weight and atmospheric conditions.

16. The method of claim 11, further comprising calculating projections of the aircraft performance along the flight path, during which at least a portion of the flight path is between the aircraft performance contour boundaries, and displaying the projections of the aircraft performance along the flight path.

17. The method of claim 11, wherein the accepting, the calculating, and the causing perform their respective functions in advance of the aircraft's commencing the flight along the flight path.

18. The method of claim 11, further comprising applying a constant aircraft flight path state for a given time or distance following a change of altitude or speed by the aircraft.

19. The method of claim 11, further comprising calculating the aircraft performance using a dynamically changing aircraft performance model.

20. The method of claim 19, further comprising changing the aircraft performance model dynamically based on a change of the input data.

21. A computer program product comprising:
    a non-transitory computer-readable medium configured to store instructions for performing flight planning decision support, the instructions, when loaded and executed by a processor, cause the processor to:
    accept input data related to an aircraft, the input data including (i) flight plan data that includes a flight path of the aircraft, (ii) state of the aircraft along the flight path, (iii) environmental data, and (iv) an aircraft performance model of the aircraft;
    calculate aircraft performance and an objective function for a range of altitudes and speeds as a function of the input data; and
    cause a user interface to display, over the range of altitudes and speeds, aircraft performance contour boundaries and a vertical routing path that meets the objective function to provide graphical representations to support a user's planning decisions of fuel efficiency of the aircraft versus time of arrival of the aircraft along the flight path, the user's planning decisions including selections of altitudes or speeds from the range of altitudes and speeds.

22. The apparatus of claim 1, wherein the input module is further configured to accept an input from the user and the calculation module is configured to apply the input to the objective function.

23. A flight planning decision support apparatus, comprising:

an input module configured to accept input data related to an aircraft, the input data including (i) flight plan data that includes a flight path of the aircraft, (ii) state of the aircraft along the flight path, (iii) environmental data, and (iv) an aircraft performance model of the aircraft;
a calculation module configured to calculate aircraft performance and an objective function for a range of altitudes and speeds as a function of the input data; and
a display module configured to cause a user interface to display, over the range of altitudes and speeds, aircraft performance contour boundaries based on the objective function to provide graphical representations to support a user's planning decisions of fuel efficiency of the aircraft versus time of arrival of the aircraft along the flight path, the user's planning decisions including selections of altitudes or speeds from the range of altitudes and speeds.

24. The apparatus of claim 22, wherein the input from the user is a selection of an altitude or speed from the range of altitudes and speeds based upon an efficiency tunnel, the efficiency tunnel corresponding to the aircraft performance contour boundaries displayed, the selection causing an adjustment to a flight path such that at least a portion of the flight path is between the displayed aircraft performance contour boundaries.

25. The apparatus of claim 24, wherein the control module is configured to calculate projections of aircraft performance along the adjusted flight path, and wherein the display module is configured to display the projections of aircraft performance along the adjusted flight path.

\* \* \* \* \*